United States Patent
Riou et al.

(10) Patent No.: US 11,192,776 B2
(45) Date of Patent: Dec. 7, 2021

(54) ELECTRONIC ASSEMBLY AND PRESSURE MEASUREMENT DEVICE WITH IMPROVED DURABILITY

(71) Applicant: SAFRAN ELECTRONICS & DEFENSE, Paris (FR)

(72) Inventors: Jean-Christophe Riou, Paris (FR); Nawres Sridi-Convers, Paris (FR); Eric Bailly, Paris (FR)

(73) Assignee: SAFRAN ELECTRONICS & DEFENSE, Boulogne-Billancourt (FR)

( * ) Notice: Subject to any disclaimer, the term of this patent is extended or adjusted under 35 U.S.C. 154(b) by 0 days.

(21) Appl. No.: 17/279,787

(22) PCT Filed: Oct. 9, 2019

(86) PCT No.: PCT/EP2019/077425
§ 371 (c)(1),
(2) Date: Mar. 25, 2021

(87) PCT Pub. No.: WO2020/074616
PCT Pub. Date: Apr. 16, 2020

(65) Prior Publication Data
US 2021/0309511 A1 Oct. 7, 2021

(30) Foreign Application Priority Data
Oct. 11, 2018 (FR) ..................... 18 59426

(51) Int. Cl.
*B81B 7/00* (2006.01)
*B81C 3/00* (2006.01)
(Continued)

(52) U.S. Cl.
CPC ............ *B81B 7/0048* (2013.01); *B81C 3/001* (2013.01); *G01L 19/0061* (2013.01);
(Continued)

(58) Field of Classification Search
None
See application file for complete search history.

(56) References Cited

U.S. PATENT DOCUMENTS

2006/0196408 A1 9/2006 Hashimoto
2007/0013014 A1 1/2007 Guo et al.
(Continued)

FOREIGN PATENT DOCUMENTS

EP 1667508 A1 6/2006

*Primary Examiner* — Andre J Allen
*Assistant Examiner* — Jermaine L Jenkins
(74) *Attorney, Agent, or Firm* — Muncy, Geissler, Olds & Lowe, P.C.

(57) ABSTRACT

A device having both an electronic assembly having an electronic component assembled on a first substrate, and also a body defining a cavity having a first end in fluid flow communication with a fluid, the electronic component extending inside the cavity and the first substrate including a portion in contact with a wall of the cavity. The coefficient of thermal expansion of the material of the first substrate is less than that of the electronic component, and the electronic component is assembled on the first substrate by a brazing type assembly method involving the application of heat. A method of making an electronic assembly. An assembly obtained by the method.

29 Claims, 5 Drawing Sheets

(51) Int. Cl.
*G01L 19/00* (2006.01)
*G01L 19/04* (2006.01)

(52) U.S. Cl.
CPC ...... *G01L 19/04* (2013.01); *B81B 2201/0264* (2013.01); *B81B 2203/0163* (2013.01); *B81B 2203/0315* (2013.01); *B81B 2207/012* (2013.01); *B81C 2203/035* (2013.01)

(56) References Cited

U.S. PATENT DOCUMENTS

| | | | | |
|---|---|---|---|---|
| 2008/0277747 | A1* | 11/2008 | Ahmad | G01L 19/04 |
| | | | | 257/415 |
| 2010/0060108 | A1* | 3/2010 | Yamada | H05K 3/3442 |
| | | | | 310/348 |
| 2010/0244246 | A1* | 9/2010 | Caplet | H01L 24/11 |
| | | | | 257/738 |
| 2011/0038132 | A1* | 2/2011 | Ochiai | H01L 24/94 |
| | | | | 361/760 |
| 2017/0334713 | A1* | 11/2017 | Golden | G01L 13/025 |
| 2018/0031434 | A1* | 2/2018 | Kober | G01L 19/0007 |
| 2018/0313711 | A1* | 11/2018 | Sixtensson | G01L 19/04 |
| 2020/0391994 | A1* | 12/2020 | Robert | B81B 7/02 |

* cited by examiner

Fig. 5

ELECTRONIC ASSEMBLY AND PRESSURE MEASUREMENT DEVICE WITH IMPROVED DURABILITY

FIELD OF THE INVENTION

The present invention relates to the field of electronic assemblies, and more particularly to the field of electromechanical fluid pressure sensors for aviation applications.

BACKGROUND OF THE INVENTION

Conventionally, an electronic assembly comprises a substrate having an electric component fitted thereon using a soldered or sintered joint. The assembly provides a mechanical and electrical junction between the electronic component and the substrate. In operation, the assembly is subjected to thermal cycles, and differential expansion of the substrate and of the component applies stress to the joint and to the electronic component, which can affect its measurement accuracy and its durability.

Using a joint made of flexible conductive adhesive serves to provide mechanical decoupling between the substrate and the component and to reduce the effect of differential expansion on the accuracy of the sensor and on its durability. Nevertheless, although mechanical performance is good, conductive metal flakes of the adhesive joint are observed to migrate and its electrical resistance is observed to increase considerably over time.

Thus, existing electronic assemblies do not guarantee a durable mechanical and electrical junction between the component and the substrate, while also providing a level of thermomechanical decoupling that is adapted to the sizes and the sensitivities of the component and of the measurement devices.

OBJECT OF THE INVENTION

An object of the invention is to improve the ability of an electronic assembly to withstand fatigue when subjected to thermomechanical stress.

SUMMARY OF THE INVENTION

To this end, there is provided a device having both an electronic assembly comprising an electronic component assembled on a first substrate, and also a body defining a cavity having a first end in fluid flow communication with a fluid, the electronic component extending inside the cavity and the first substrate including a portion in contact with a wall of the cavity. Advantageously, the coefficient of thermal expansion of the material of the first substrate is less than that of the electronic component, and the electronic component is assembled on the first substrate by a brazing type assembly method involving the application of heat. Such a device serves to attenuate vibration and thermomechanical forces transmitted from the surrounding medium to the electronic components. Fastening the assembly on the device is also made simpler by such a technique.

The device of the invention is particularly suited to measuring pressure when the electronic component is a pressure sensor.

Vibration and thermomechanical forces are even more strongly attenuated when the substrate is a flexible substrate.

The amplitude of the movements of the first substrate is effectively limited when the portion in contact with a wall of the cavity is a curved portion.

Vibration and thermomechanical forces are transmitted from the surrounding medium to the electronic component with improved attenuation when the first substrate exerts a resilient force on the wall of the cavity.

Pressure transients and microparticles are effectively filtered when the first substrate includes orifices for passing a fraction of the fluid that is to have its pressure measured.

Construction of the device is made easier when the first substrate is connected to a second substrate that carries a communication unit and a communication port.

Advantageously, the second substrate is a rigid substrate or a flexible substrate.

Also advantageously, the second substrate extends in part into the cavity.

Filtering of the fluid to be measured is improved when the device includes a grid extending in front of the first end of the cavity.

Construction of the device is also inexpensive when the cavity is defined at least in part by a liner made of metal, preferably of stainless steel.

Construction of the device is inexpensive when the body is made of thermoplastic material.

The invention also provides a method of making an electronic assembly, the method comprising, during a preparatory stage, the steps of selecting an electronic component and of selecting a first substrate on which the electronic component is to be assembled, the first substrate being selected in such a manner that the coefficient of thermal expansion of the material of the substrate is less than that of the electronic component. The method also comprises, during an assembly stage, assembling together the electronic component and the substrate by a brazing type assembly method involving the application of heat.

At the end of the assembly operation, the difference between the coefficients of thermal expansion of the component and the first substrate gives rise to differential shrinkage of the component and of the first substrate, thereby applying prestress to the first substrate. When the assembly is subjected to temperature cycles, the maximum force to which the connection points between the substrate and the component are subjected is reduced by the value of the prestress, thereby improving the fatigue strength of the assembly of the invention. The robustness of the assembly is improved when the preparatory stage includes the additional step of selecting an electronic component and a first substrate, both made of materials having a glass transition temperature or a melting temperature that is higher than a service temperature of the electronic assembly.

Fatigue strength is further improved when the preparatory stage includes the additional step of selecting a first substrate and an electronic component and also an assembly technique that leads, after assembly, to stress of less than 0.1 newtons per square millimeter ($N/mm^2$) in the junction points between the substrate and the component.

It is possible to make the electronic assembly reliably and inexpensively when the assembly method with application of heat is soldering or sintering or silver sintering or comprises making connections with balls of gold.

The invention also provides an electronic assembly obtained by the above method.

The assembly can easily be incorporated in a compact device when the selected first substrate is a flexible substrate.

The operations of making connections between the substrate and the component are facilitated when the first substrate is a textured substrate.

Fatigue strength is improved when the first substrate is a substrate based on liquid crystal polymers.

The assembly is easier to make when the assembly comprises a flip chip assembled component.

The compactness of the assembly is improved when the assembly comprises at least one component including a stack of chips.

The assembly is effectively protected when it is covered at least in part in a layer of Parylene.

Advantageously, the substrate has a thickness of less than 100 micrometers (μm) and/or a face of the substrate that includes a portion covered in a layer of metallization having thickness less than 15 μm.

Other characteristics and advantages of the invention appear from the following description of nonlimiting embodiments of the invention.

BRIEF DESCRIPTION OF THE DRAWINGS

Reference is made to the accompanying figures, in which.

DETAILED DESCRIPTION OF THE INVENTION

Figure 1:
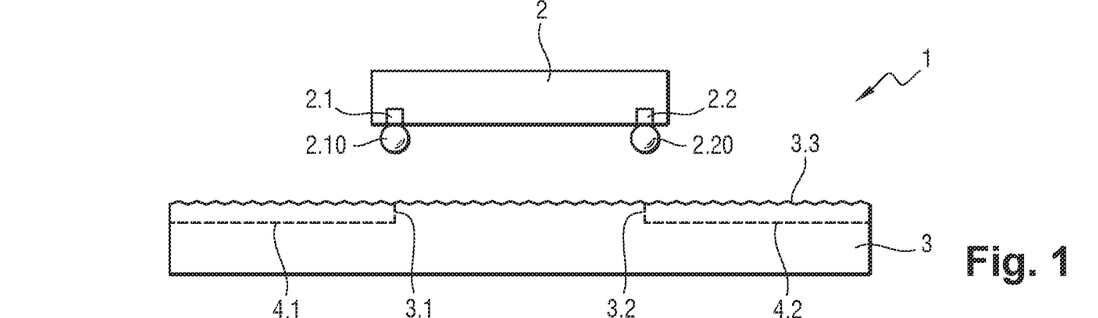
FIG. 1 is a diagrammatic section view of a first step in making an assembly of the invention.

With reference to FIG. 1, an electronic assembly of the invention, given overall reference 1, is made by soldering an electronic component 2 on a first substrate 3. The assembly is for operation at a maximum service temperature of the order of 200° C.

In this example, the selected component 2 is a piezoresistive pressure measurement microelectro-mechanical system made of non-organic material, such as the ceramic $Al_2O_3$. Such a component 2 possesses a coefficient of thermal expansion that is substantially equal to $7 \times 10^{-6}$ per kelvin ($K^{-1}$) and a melting temperature higher than 2000° C. The component 2 is provided with a first electrical connector 2.1 provided with a first tin-based solder ball 2.10 and a second electrical connector 2.2 provided with a second tin-based solder ball 2.20.

In this example, the selected first substrate 3 is a textured flexible substrate made of silicon that is 80 μm thick. The first substrate 3 possesses a coefficient of thermal expansion that is substantially equal to $4 \times 10^{-6} K^{-1}$ and a melting temperature that is equal to 1414° C.

In the meaning of the present application, a substrate is said to be "flexible" if it can be curved elastically through more than 45°.

The first substrate 3 is provided with a third electrical connector 3.1 and a fourth electrical connector 3.2 that are connected respectively to a first conductive track 4.1 and to a second conductive track 4.2 obtained by selective metallization of the first face 3.3 of the first substrate 3 over a thickness of 10 μm.

Figure 2:
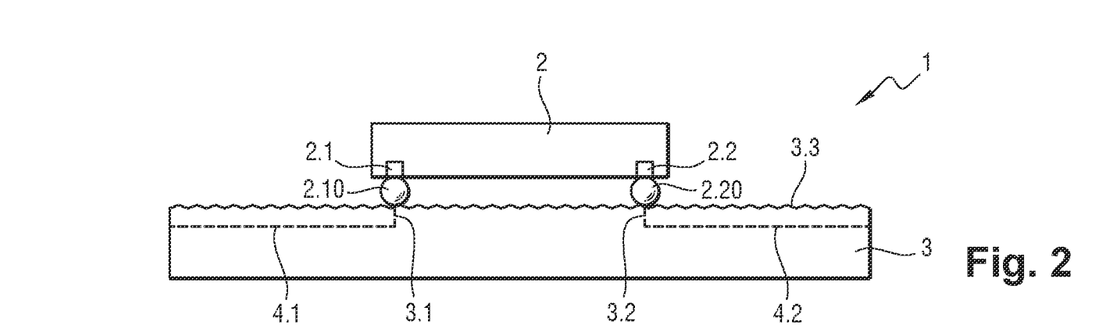
FIG. 2 is a diagrammatic section view of a second step in making the FIG. 1 assembly.

The component 2 is placed on the first substrate 3 in such a manner that the first connector 2.1 and the second connector 2.2 of the component 2 face respectively the third connector 3.1 and the fourth connector 3.2 (FIG. 2). The first ball 2.10 rests substantially on the third connector 3.1 and the second ball 2.20 rests substantially on the fourth connector 3.2. This assembly technique is also referred to as "flip chip" assembly.

Figure 3:
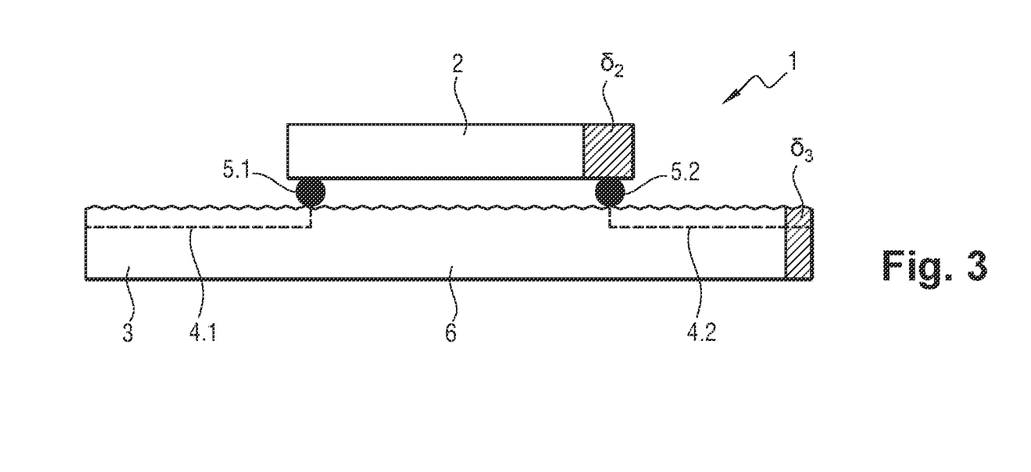
FIG. 3 is a diagrammatic section view of a third step in making the FIG. 1 assembly.

The assembly 1 is then heated (in this example by induction) and the first connector 2.1 and the third connector 3.1 are then assembled together by a first solder joint 5.1. The second connector 2.2 and the fourth connector 3.1 are assembled together by a second solder joint 5.2 (FIG. 3).

During the soldering operations and under the effect of the heat that is applied (at about 180° C.), the first substrate (which is made of a material having a coefficient of thermal expansion that is less than that of the material of the component 2) expands, as does the component 2. Thus, the value 83 of the thermal expansion of the first substrate 3 is less than the value 82 of the thermal expansion of the material of the component 2. The first connector 2.1 is soldered on the third connector 3.1 and the second connector 2.2 is soldered on the fourth connector 3.1 while both the component 2 and the first substrate 3 are expanded.

Figure 4:
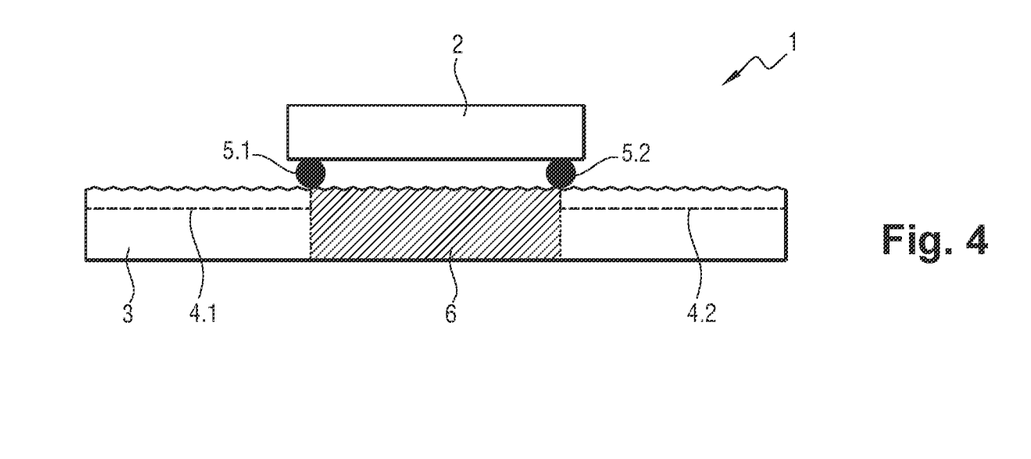
FIG. 4 is a diagrammatic section view of a fourth step in making the FIG. 1 assembly.

During cooling of the assembly 1, the greater shrinkage of the component 2 compared with the first substrate 3 applies prestress to the first portion 6 of the first substrate 3 that lies between the first solder joint 5.1 and the second solder joint 5.2 (FIG. 4).

After assembly, the stresses in the first solder joint 5.1 and in the second solder joint 5.2 are perceptibly less than 0.1 $N/mm^2$.

A 5 μm layer of Parylene is then deposited on the resulting assembly 1.

In operation, when the assembly 1 is subjected to temperature variations, the amplitude of the thermomechanical stress cycle to which the first and second solder joints 5.1 and 5.2 are subjected is reduced by the value of the prestress in the portion 6. The fatigue strength of the first and second solder joints 5.1 and 5.2 is thus improved.

An assembly 1 is thus obtained in which the first substrate 3 possesses a coefficient of thermal expansion that is less than that of the component 2 that is connected thereto.

Figure 5:
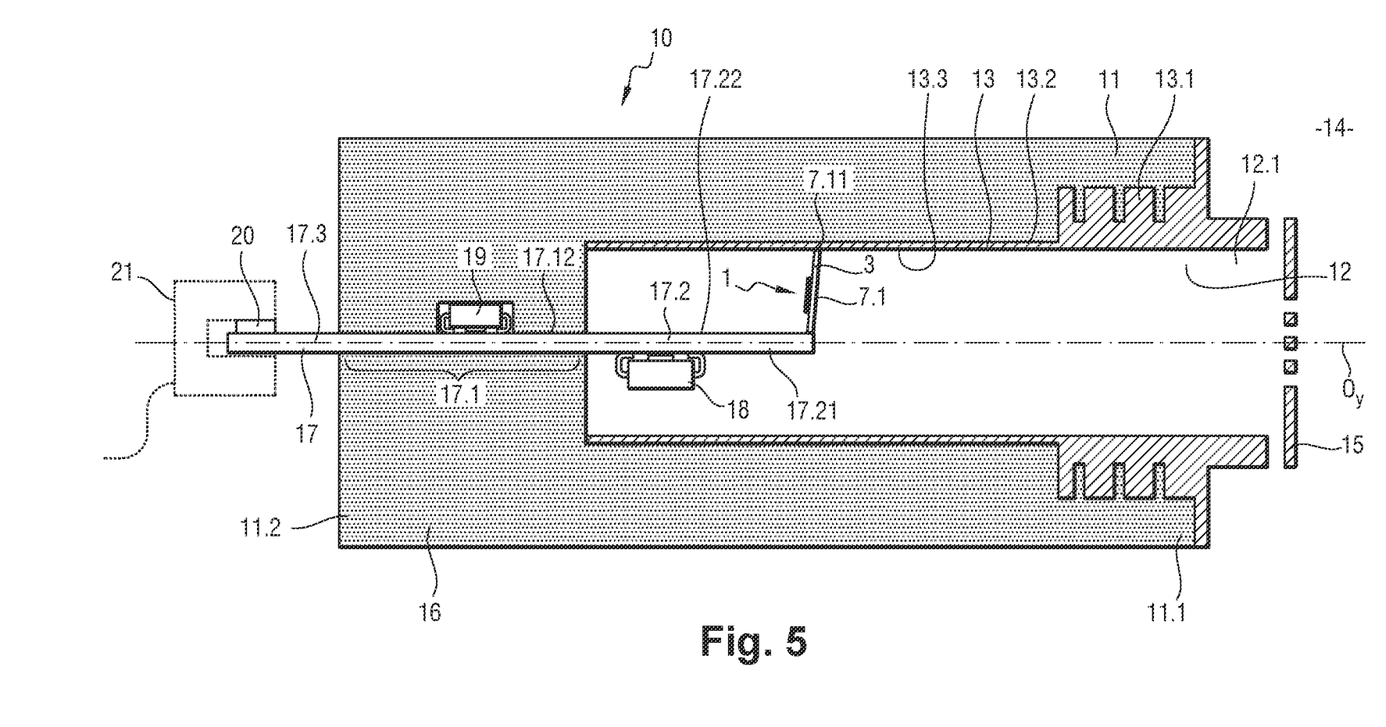
FIG. 5 is a diagrammatic section view of a pressure measurement device in a first embodiment of the invention.

With reference to FIG. 5, the assembly 1 is incorporated in a pressure measurement device 10.

The device 10 has a polyamide body 11 in the form of a right cylinder of longitudinal axis Oy. The body 11 presents a cavity 12 defined by a liner 13 made of stainless steel. In this example, the liner 13 is in the shape of a right cylinder of longitudinal axis Oy and it possesses a series 13.1 of the fins projecting radially from the outside surface 13.2 of the liner 13. A first end 12.1 of the cavity 12 opens to the outside of the cavity 12 via a first end 11.1 of the body 11 so as to be in fluid flow communication with an outside fluid 14 of pressure that is to be measured. A grid 15 extends in front of the first end 12.1 of the cavity 12. The second end 11.2 of the body 11 is closed by a transverse wall 16. An epoxy resin printed circuit 17 has an intermediate first portion 17.1 passing through the wall 16, with a second portion 17.2 extending inside the cavity 12, and a third portion 17.3 projecting outside the body 11.

The printed circuit 17 has a microprocessor 18 carried by the bottom face 17.21 of the second portion 17.2 of the printed circuit 17 and also a communication module 19 carried by the top face 17.12 of the first portion 17.1 of the printed circuit 17. As can be seen in FIG. 5, in this example the communication module 19 is embedded in the body 11. In this example, the assembly 1 is connected to the top face 17.22 of the second portion 17.2 of the printed circuit 17, and a first portion 7.1 of the first substrate 3 extends from the second portion 17.2 of the printed circuit 17 to the circuit 13 in such a manner that a first end 7.11 of the portion 7.1 of the first substrate 3 comes into contact with the inside surface 13.3 of the liner 13. Depending on its length and/or on its angle of inclination relative to the longitudinal axis Oy, the first end 7.11 of the portion 7.1 of the first substrate 3 exerts a greater or smaller resilient force of the liner 12.

Conductive tracks (not shown) carried by the printed circuit 17 connect the assembly 1, the microprocessor 18, and the communication unit 19 to a first output port 20. A connector 21 (which is drawn in dotted) lines serves to connect the device 10 to a processor unit (not shown).

The flexibility of the first substrate 3 and the particular way in which it is mounted enable the performance of the device 10 to be improved concerning its ability to withstand vibration and thermomechanical forces.

Elements that are identical or analogous to those described above are given identical numerical references in the description below of the second, third, fourth, and fifth embodiments.

Figures 6, 7:
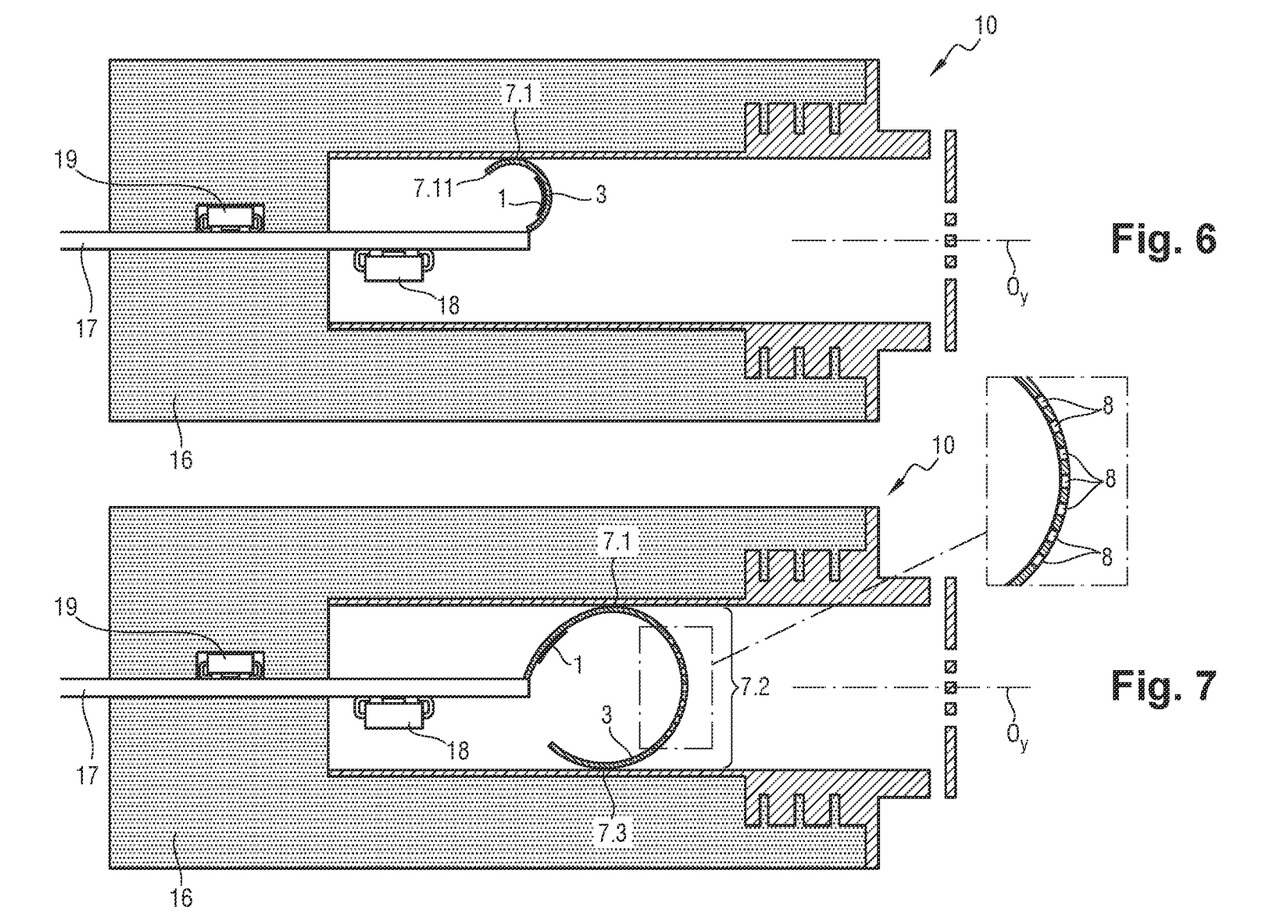
FIG. 6 is a diagrammatic section view of a pressure measurement device in a second embodiment of the invention.
FIG. 7 is a diagrammatic section view of a pressure measurement device in a third embodiment of the invention.

With reference to FIG. 6, and in a second embodiment of the invention, the first portion 7.1 of the first substrate 3 that is in contact with the liner 12 is curved and it exerts a resilient force.

With reference to FIG. 7, and in a third embodiment of the invention, the first substrate 3 has a curved first portion 7.1 that is in contact with the inside surface 13.3 of the liner 13 and a second portion 7.2 extending substantially transversely across the cavity 12. The first substrate 3 also has a curved third portion 7.3 is in contact with the inside surface 13.3 of the liner 13. Advantageously, the second portion 7.2 has ten orifices 8 for allowing the fluid 14 to pass through.

Figures 8, 9:
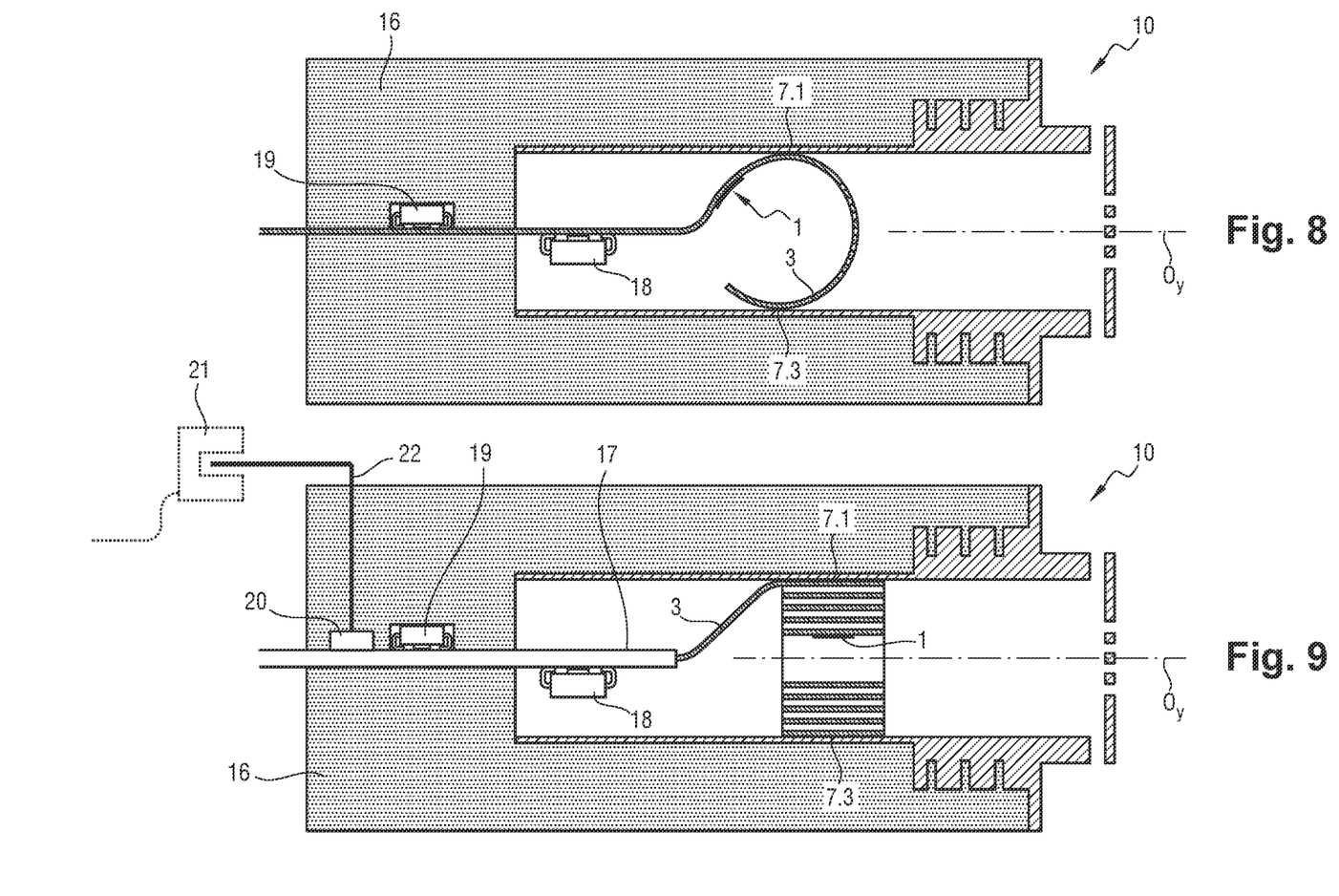
FIG. 8 is a diagrammatic section view of a pressure measurement device in a fourth embodiment of the invention.
FIG. 9 is a diagrammatic section view of a pressure measurement device in a fifth embodiment of the invention.

With reference to FIG. 8, and in a fourth embodiment of the invention, the device 10 does not have a second substrate 17 and the first substrate 3 extends through the wall 16. The first substrate 3 then carries the assembly 1 and also the microprocessor 18, the module 19, and the output port 20.

With reference to FIG. 9, and in a fifth embodiment of the invention, the first substrate 3 is shaped to present a spiral about the longitudinal axis Oy. The first substrate 3 is connected to the second substrate 17, and in this embodiment, the communication port 20 is embedded in the body 11. A pin 22 extends from the communication port 20 through the body 11 so as to project from the body 11 and receive the connector 21 at its end. The spiral shape of the first substrate 3 enables the diametrically opposite first and third portions 7.1 and 7.3 of the first substrate 3 to exert a resilient force on the liner 13 like a spiral spring.

Naturally, the invention is not limited to the embodiments described, but covers any variant coming within the ambit of the invention as defined by the claims.

In particular;
although the electronic assembly is obtained by using a method comprising both making a particular selection for the pair comprising the first substrate and the component and also assembling them together by applying heat, the device 10 may incorporate an electronic assembly obtained using a method other than a method of the invention, e.g. such as assembling a component on a flexible substrate by means of an adhesive, or indeed assembling a component on a substrate that possesses a coefficient of thermal expansion that is greater than that of the electronic component;

although above, the maximum service temperature of the assembly is of the order of 200° C., the invention applies equally to other maximum service temperatures e.g. such as service temperatures lying in the range 0 to 200° C., temperatures that are negative, or temperatures that are greater than 200° C.;

although above, the component is a piezoresistive pressure measurement microelectromechanical system, the invention applies equally to other types of component, e.g. such as micro- or nano-electromechanical systems that may be capacitive or inductive and that serve to measure a pressure or a temperature, or to perform a logic, calculation, or communication function;

although above, the component has two connectors, the invention applies equally to other types of component, e.g. such as components having a single connector or more than two;

although above, the substrate has a thickness of 80 µm, the invention applies equally to other types of substrate, e.g. such as a substrate of thickness lying in the range 1 µm to 80 µm, or of thickness greater than 80 µm, preferably less than 100 µm;

although above, the conductive tracks are obtained by selective metallization of a first face of the first substrate over a thickness of 10 µm, the invention applies equally to other electrical connection means that could comprise, for example, conductive wires and/or internal conductive tracks and/or conductive tracks that are printed or obtained by selective exposure of the substrate, it being possible for the thickness of the tracks to be less than 10 µm or greater than 11 µm, ideally less than 15 µm, and the tracks may extend on both of the faces of the substrate;

although above, the processor unit is a microprocessor, the invention applies equally to other processor means, e.g. such as a microcontroller, a field programmable gate array (FPGA), or an application-specific integrated circuit (ASIC);

although above, the assembly is covered in a 5 µm layer of Parylene, the invention applies equally to other types of protective layer, e.g. such as a layer of Parylene that is less than 5 µm thick or greater than 6 µm thick, preferably less than 10 µm thick, a layer of silicone, of acrylic, or of polyurethane;

although above, the device includes a stainless steel liner defining a cavity in the device, the invention applies equally to other ways of defining a cavity, e.g. such as a liner co-operating with the body to define the cavity in part, or a cavity that is defined in full by the body of the device without a liner;

although above, the liner is made of stainless steel, the invention applies equally to liners made of other materials, e.g. such as a liner made of a nonferrous metal such as copper or bronze, or a liner made of synthetic material (e.g. polyamide) or of glass or carbon fibers;

although above, the body of the device is made of polyamide, the invention applies equally to other types of thermoplastic material, e.g. such as low or high density polyethylene and polyvinyl chloride (PVC), or thermosetting materials such as formaldehyde or polyester;

although above, the cavity in the device is in the form of a right cylinder, the invention applies equally to cavities of other types, e.g. such as cavities that are of spherical, conical, or arbitrary shape;

although above, the second substrate is made of epoxy resin, the invention applies equally to second substrates of other types, e.g. such as a flexible substrate made of liquid crystal polymers or a rigid substrate made of polyimide;

although above, the communication module is carried by the top face of the second substrate while being embedded in the body of the device, the invention applies equally to other configurations of the communication module, e.g. such as a communication module carried by a bottom face of the second substrate, a communication module extending in full or in part in the cavity, a module that is partially embedded in the body, or a communication module that is situated outside the body;

although above, pressure measurements are transmitted to an external communication circuit via a wire connector, the invention applies equally to other communication means, e.g. such as wireless communication means of Bluetooth, Wi-Fi, or radio type;

although above, the component is connected to the first substrate by tin-based solder, the invention applies equally to other methods of assembly involving the application of heat, e.g. silver- or gold-based solder, silver sintering, or indeed a method involving making connections with balls of gold;

although above, the component is a single component, the invention applies equally to a component made up of a stack of chips, also known as a "stack chip";

although above, the first substrate has ten orifices for passing the fluid that is to have its pressure measured, the invention applies equally to a first substrate having a different number of orifices, e.g. such as one to nine orifices or more than ten;

although above, the components and the substrate are selected with reference to their melting temperatures, when the materials are inorganic materials, they should ideally be selected with reference to their glass transition temperatures.

The invention claimed is:

1. A device having both an electronic assembly comprising an electronic component assembled on a first substrate, and also a body defining a cavity having a first end in fluid flow communication with a fluid, the electronic component extending inside the cavity and the first substrate including a portion in contact with a wall of the cavity;
wherein the coefficient of thermal expansion of the material of the first substrate is less than that of the electronic component, and the electronic component is assembled on the first substrate by a brazing type assembly method involving the application of heat.

2. The device according to claim 1, wherein the electronic component is a pressure sensor.

3. The device according to claim 1, wherein the first substrate is a flexible substrate.

4. The device according to claim 1, wherein the portion in contact with a wall of the cavity is a curved portion.

5. The device according to claim 1, wherein the first substrate exerts a resilient force on the wall of the cavity.

6. The device according to claim 1, wherein the first substrate includes orifices for passing a fraction of the fluid.

7. The device according to claim 1, wherein the first substrate is connected to a second substrate that carries a communication unit and a communication port.

8. The device according to claim 7, wherein the second substrate is a rigid substrate or a flexible substrate.

9. The device according to claim 7, wherein the second substrate extends in part into the cavity.

10. The device according to claim 1, including a grid extending in front of the first end of the cavity.

11. The device according to claim 1, wherein the cavity is defined, at least in part, by a metal liner.

12. The device according to claim 11, wherein the liner is made of stainless steel.

13. The device according to claim 1, wherein the body is made of thermoplastic material.

14. A method of making an electronic assembly, the method comprising the following steps:
during a preparatory stage:
selecting an electronic component; and
selecting a first substrate on which the electronic component is to be assembled, the first substrate being selected in such a manner that the coefficient of thermal expansion of the material of the first substrate is less than that of the electronic component; and
during an assembly stage:
assembling together the electronic component and the first substrate by a brazing type assembly method involving the application of heat.

15. The method of making an electronic assembly according to claim 14, wherein the preparatory stage includes the additional step of selecting an electronic component and a first substrate, both made of materials having a glass transition temperature and/or a melting temperature that is higher than a service temperature of the electronic assembly.

16. The method of making an electronic assembly according to claim 14, wherein the preparatory stage includes the additional step of selecting an electronic component and a first substrate and also an assembly technique that leads, after assembly, to stress of less than 0.1 N/mm$^2$ in the junction points between the electronic component and the first substrate.

17. The method of making an electronic assembly according to any claim 14, wherein the assembly method with application of heat is soldering.

18. The method of making an electronic assembly according to claim 14, wherein the assembly method with application of heat is sintering.

19. The method of making an electronic assembly according to claim 14, wherein the assembly method with application of heat is silver sintering.

20. The method of making an electronic assembly according to claim 14, wherein the assembly referred with application of heat comprises making connections with balls of gold.

21. An electronic assembly obtained by the method according to claim 14.

22. The electronic assembly according to claim 21, wherein the selected first substrate is a flexible substrate.

23. The electronic assembly according to claim 21, wherein the first substrate is a textured substrate.

24. The electronic assembly according to claim 21, wherein the first substrate is a substrate based on liquid crystal polymers.

25. The electronic assembly according to claim 21, including at least one flip chip assembled component.

26. The electronic assembly according to claim 21, including at least one component comprising a stack chip.

27. The electronic assembly according to claim 21, wherein the electronic assembly is covered, at least in part, by a layer of Parylene.

28. The electronic assembly according to claim 21, wherein the first substrate has a thickness that is less than 100 μm.

29. The electronic assembly according to claim 21, wherein at least one face of the first substrate includes a portion covered in a layer of metallization of thickness less than 15 μm.

* * * * *